US006661208B2

(12) United States Patent
Rutter et al.

(10) Patent No.: US 6,661,208 B2
(45) Date of Patent: Dec. 9, 2003

(54) SYNCHRONOUS DC-DC REGULATOR WITH SHOOT-THROUGH PREVENTION

(75) Inventors: Philip Rutter, Stockport (GB); Leonardus De Groot, Budel (NL); Nicolas J. Wheeler, Manchester (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/067,046

(22) Filed: Feb. 4, 2002

(65) Prior Publication Data

US 2002/0105309 A1 Aug. 8, 2002

(30) Foreign Application Priority Data

Feb. 6, 2001 (GB) .................................. 0102912
May 24, 2001 (GB) .................................. 0112582

(51) Int. Cl.[7] ................................. G05F 3/16
(52) U.S. Cl. ............................... 323/224; 323/284
(58) Field of Search ........................ 323/224, 282, 323/283, 284

(56) References Cited

U.S. PATENT DOCUMENTS 4,801,859 A * 1/1989 Dishner ................... 323/224
5,355,077 A * 10/1994 Kates ...................... 323/224
5,365,118 A * 11/1994 Wilcox ..................... 327/109
5,479,089 A    12/1995 Lee ........................ 323/283
5,894,243 A *  4/1999 Hwang .................... 327/540
5,963,066 A * 10/1999 Fukunaga ................. 327/112
6,175,225 B1   1/2001 De Groot .................. 323/282
6,184,585 B1   2/2001 Martinez et al. ........... 257/777
6,218,817 B1 *  4/2001 Chang .................... 323/283
6,452,368 B1 *  9/2002 Basso et al. .............. 323/282
6,472,855 B2 * 10/2002 Ball ...................... 323/282

FOREIGN PATENT DOCUMENTS

WO    WO9849607    4/1998

* cited by examiner

Primary Examiner—Shawn Riley
(74) Attorney, Agent, or Firm—Steven R. Biren

(57) ABSTRACT

A synchronous dc—dc converter converts an input dc voltage to an output dc voltage. A control FET (6) and a sync FET (8) are connected in series between input dc voltage terminals (2,4). An alternating control signal input from a control circuit (18) controls the control and sync FETs (6,8) to be switched on alternately. At least one driver (30, 32) is provided to drive the FETs (6,8). In response to a change in the alternating control signal of a predetermined polarity, the driver (32) switches off the sync FET (8), and then the driver (30) waits for the trigger signal before switching on the control FET (6).

10 Claims, 7 Drawing Sheets

SYNCHRONOUS DC-DC REGULATOR WITH SHOOT-THROUGH PREVENTION

TECHNICAL FIELD

The invention relates to a synchronous dc—dc converter circuit and to a method of operating a synchronous dc—dc converter, as well as to components for use in such a converter.

BACKGROUND AND SUMMARY OF THE INVENTION

Direct current (dc) to dc converters are known in the art, and are generally used to convert from one dc voltage level to another, for example to provide a 1.5V voltage rail from a 12V voltage supply.

One type of converter, a synchronous dc—dc converter, is illustrated schematically in FIG. 1. An input voltage $V_{in}$ is applied between input terminals 2, 4. A pair of transistors, here field effect transistors 6, 8, are connected between the input terminals 2, 4. The transistor 6 adjacent to the input terminal 4 is known as the control FET or high side transistor, and the transistor 8 adjacent to the ground is know as the synchronous (sync) FET or low side transistor. The high side is relatively more positive than the low side, though it is not necessary that either the high or the low side has any particular relationship to ground.

The node between the transistors 6, 8 is known as the switch node 10. The switch node feeds through an inductor 12 and across a capacitor 14 to an output 16.

The control and sync FETs are driven by respective drivers 30,32.

A control circuit 18 has one input on an input control terminal 20 and another input fed from the output 16 via a feedback path 22. The control circuit 18 supplies control signals to control the FETs 6,8 to maintain a constant voltage at the output by switching transistors 6,8 off and on alternately. The control signals are alternating signals which cause the control and sync FETs to conduct alternately. The mark-space ratio is varied, i.e. the ratio of the time for which the control FET conducts to the time the sync FET conducts is modulated, to achieve the desired voltage on the output 16.

Examples of such dc—dc converters include those presented in WO98/49607 to Intel Corporation and U.S. Pat. No. 5,479,089 to Lee.

One feature of synchronous dc—dc converters is that it is not generally desired to switch on both high and low side transistors 6,8 simultaneously. If both transistors are on, the input voltage is short-circuited by current passing directly between the two input terminals 2,4 through the control and sync FETs. This phenomenon is known as "shoot-through". Accordingly, the control circuit 18 is generally arranged to ensure that only one of the two transistors 6,8 is on at a time.

This is conventionally carried out by monitoring two voltages. The voltage at the switch node 10 is monitored to prevent the switching on of the low side transistor 8 until the high side transistor 6 is switched off. The voltage at the gate 110 of the low side transistor 8 is monitored to prevent the high side transistor switching on until the low side transistor 8 is switched off. WO98/49607 describes a circuit of this type, as does U.S. Pat. No. 5,479,089 to Lee.

The dead time when neither FET is conducting depends on the transistor threshold voltage and the capacitance of the sync FET, which vary widely due to manufacturing spread of parameters of the chosen FET, as well as according to the individual choice of FET. This means that a control IC has to use conservative estimates of these parameters to produce a dead time that will avoid shoot through. This is generally a longer dead time than would be possible if the control circuit were optimised for the specific FETs used.

The present trend is to increase switching and clock speeds, which increases the significance of the dead time during which neither high or low side transistor 6,8 is on. It would be beneficial to reduce this time.

A further disadvantage occurs in the case that a plurality of FETs in parallel are used in place of the single high and low side transistors. The parallel FETs never switch at exactly the same time due to different gate resistances and other parameters caused again by manufacturing variations or variability in the circuit in which the FETs are provided. Thus, it becomes difficult to correctly determine when all of the high side or low side FETs are switched off and accordingly when the other FETs can be switched on. The solution generally adopted is to include a gate resistor in the circuit, but this slows down the switching of the MOSFETs and increases switching losses, especially at high frequencies. Accordingly, it would be beneficial to provide a circuit arrangement that could more easily use parallel FETs.

According to the invention there is provided a synchronous dc—dc converter circuit for converting an input dc voltage of predetermined polarity to an output dc voltage, the synchronous dc—dc converter circuit comprising a dc input and a ground input for supplying the input dc voltage; a control FET having source and drain connected between the dc input and a switch node, the switch node being for connection through an inductor to an output; a sync FET having source and drain connected between the switch node and the ground input; a switching input for inputting an alternating control signal;

a comparator for detecting a voltage change on the switch node of opposite polarity to the dc input voltage and sending out a trigger signal in response; and at least one driver for driving the control and sync FETs alternately in response to the alternating control signal on the switching input, wherein the driver, in response to a change in the alternating control signal of a predetermined polarity, switches off the sync FET, and then waits for the trigger signal before switching on the control FET.

The arrangement is efficient at reducing dead time. Further, the arrangement works with a variety of FETs and whether or not the FETs are used in parallel.

Preferably, the voltage on the switch node is used to control both the control and the sync FETs to avoid shoot through.

In particular, a comparator may be provided to trigger a signal to switch the next FET on when the switch node voltage falls below a predetermined value. The comparator may function as an edge detector, for example by being a.c. coupled to the switch node through a capacitor.

The predetermined value may be of opposite sign to the dc input voltage.

The same predetermined value may be used for both the control and the sync FETs.

The control FET may be packaged together with a driver, and the sync FET may be provided in a separate package likewise with its driver. Both drivers may be responsive to the voltage of the switch node to determine when the FET can be switched on. This avoids any need for connection between the two packages, apart from the switching signal input, since the switch node voltage is available to both packages.

Previously, where separate control and sync FET driver packages have been provided there has been a need for interconnection between the packages to pass information related to the sync FET gate voltage to the control FET driver to avoid shoot-through. By using the switch node voltage to control both FETs, this need is avoided.

The invention also relates to a high side component for a synchronous dc—dc converter circuit for converting an input dc voltage of predetermined polarity to an output dc voltage, the high side component comprising: a dc input for supplying the input dc voltage; a control FET having source and drain connected between the dc input and a switch node, the switch node being for connection through an inductor to an output; a switching input for inputting an alternating control signal; an edge detector for detecting an edge on the switch node of opposite polarity to the dc input voltage and sending out a trigger signal in response; and at least one driver for driving the control FET in response to the alternating signal on the switching input wherein in response to a change in polarity of the alternating signal of first predetermined sign the driver switches off the control FET and in response to a change in polarity of the alternating signal of second predetermined sign the driver waits for the trigger signal and then switches on the control FET.

Further, the invention also relates to a method of operating a synchronous dc—dc converter circuit having a control FET connected between an input dc terminal and a switch node and a sync FET connected between the switch node and a ground terminal, the method comprising: supplying an input dc voltage of predermined polarity between the input dc terminal and the ground terminal; supplying a pulse width modulated alternating signal to a switching input; and driving the control and sync FETs alternately in response to the alternating signal on the switching input, by: in response to a change in polarity of the alternating signal from a first polarity to a second polarity carrying out the steps of switching off one of the control FET, detecting an edge on the switch node of opposite polarity to the dc input voltage, and then switching on the sync FET, and in response to a change of polarity of the alternating signal from the second polarity to the first polarity carrying out the steps of switching off the sync FET, detecting an edge on the switch node of opposite polarity to the dc input voltage, and then switching on the control FET.

BRIEF DESCRIPTION OF THE DRAWING FIGURES

For a better understanding of the invention specific embodiments will now be described, purely by way of example, with reference to the accompanying drawings in which.

Like or corresponding components are given the same reference numerals throughout.

DETAILED DESCRIPTION

Figure 1:
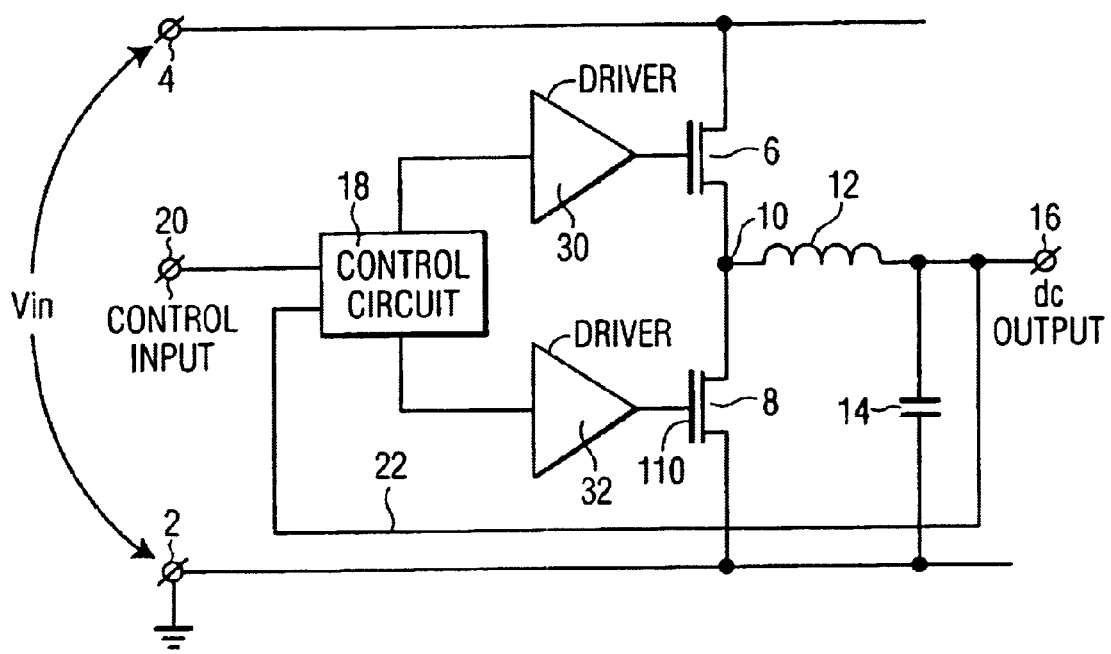
FIG. 1 shows a schematic diagram of a conventional synchronous dc—dc converter.
Figure 2:
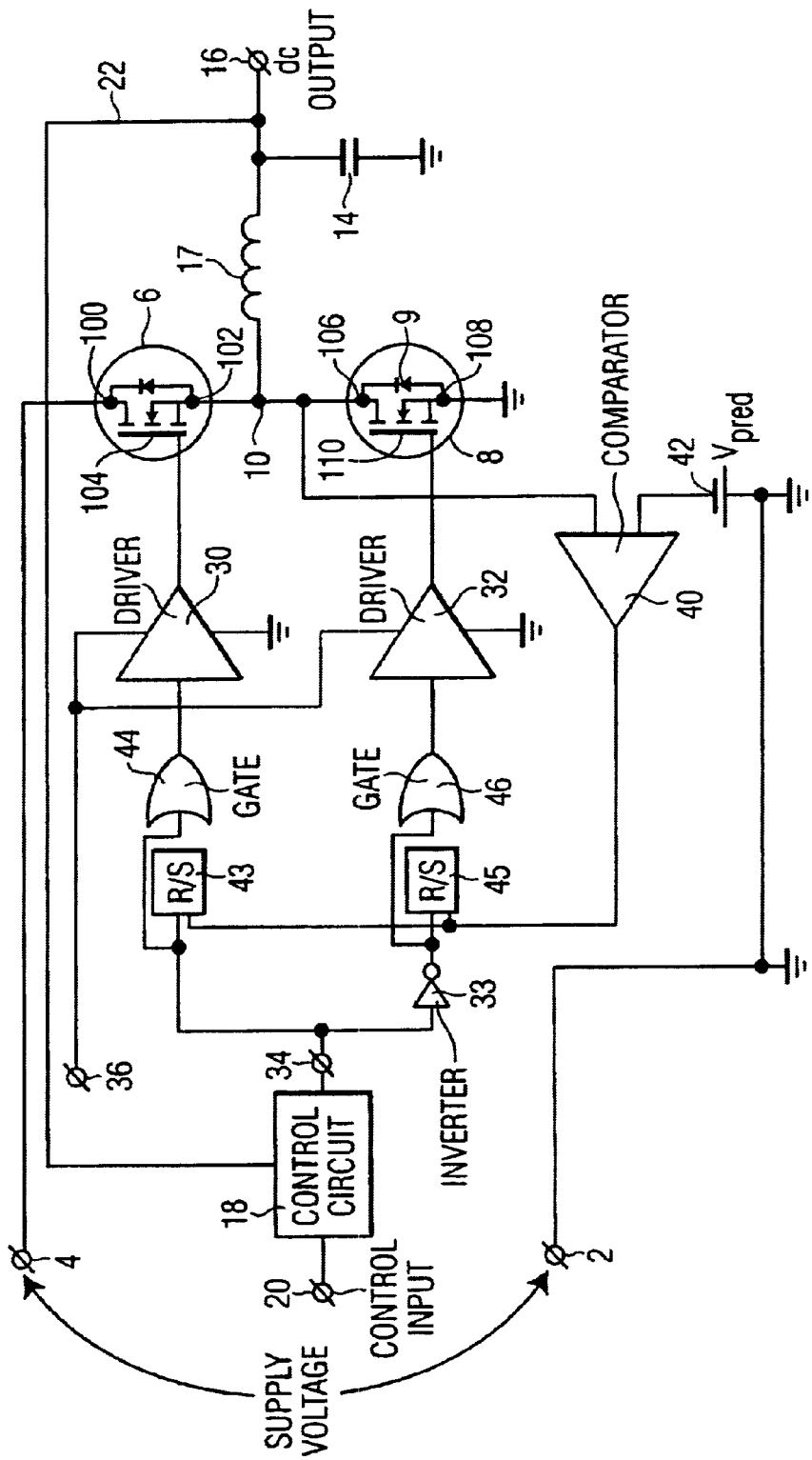
FIG. 2 shows a schematic diagram of a first embodiment of the invention.

Referring to FIG. 2, in a first embodiment of a synchronous dc—dc converter circuit according to the invention a supply voltage is input to a supply input 4 and ground 2. A high-side control FET 6 and low-side sync FET 8 are connected in series between the supply input 4 and ground 2. The drain 100 of the control FET 6 is connected to the supply input 4 and the source 102 to switch node 10. The drain 106 of the sync FET 8 is connected to the switch node 10 and the source 108 to ground.

The switch node 10 is connected through an inductor 12 and a capacitor 14 to ground. The output 16 of the circuit is taken between the inductor 12 and the capacitor 14.

The gate 104 of the high-side control FET 6 is driven by high-side driver 30. A low side driver 32 drives the gate 110 of the low-side sync FET 8.

A control circuit 18 provides an alternating pulse width modulated (PWM) switching signal through control node 34. The control circuit drives the high-side driver 30 positively and the low side driver through an inverter 38. A feedback path 22 provides feedback from the output 16 to the control circuit 18.

The mark-space ratio of the alternating PWM switching signal, i.e. the ratio of time that the switching signal is high to the time that it is low, is varied by the control circuit 18 to control the output voltage at 16. The control circuit 18 will not be described further as a variety of suitable circuits are known. Indeed, it is a feature of the invention that it can be used with a wide variety of control circuits that provide suitable PWM output signals.

A separate voltage input 36 provides power for the drivers 30,32.

A comparator 40 compares the voltage on the switch node 10 with a predetermined voltage 42. The predetermined voltage is negative, i.e. of opposite sign to the supply input voltage supplied on the supply input 4. When the voltage falls below the predetermined voltage the comparator is triggered. This allows the switching signal to pass into the drivers 30,32 through respective set-reset latches 43,45 and AND gates 44,46.

The switching of the transistors 6,8 will be described in more detail with reference to FIG. 3.

The control circuit 18 outputs a sequence 62 of control signal switching pulses to the control node 34. The mark-space ratio of the sequence 62 is controlled using feedback from the feedback path 22 to maintain the voltage at the output 16 at a required value. The sequence 62 of switching pulses are illustrated in the upper part of FIG. 3.

Figure 3:
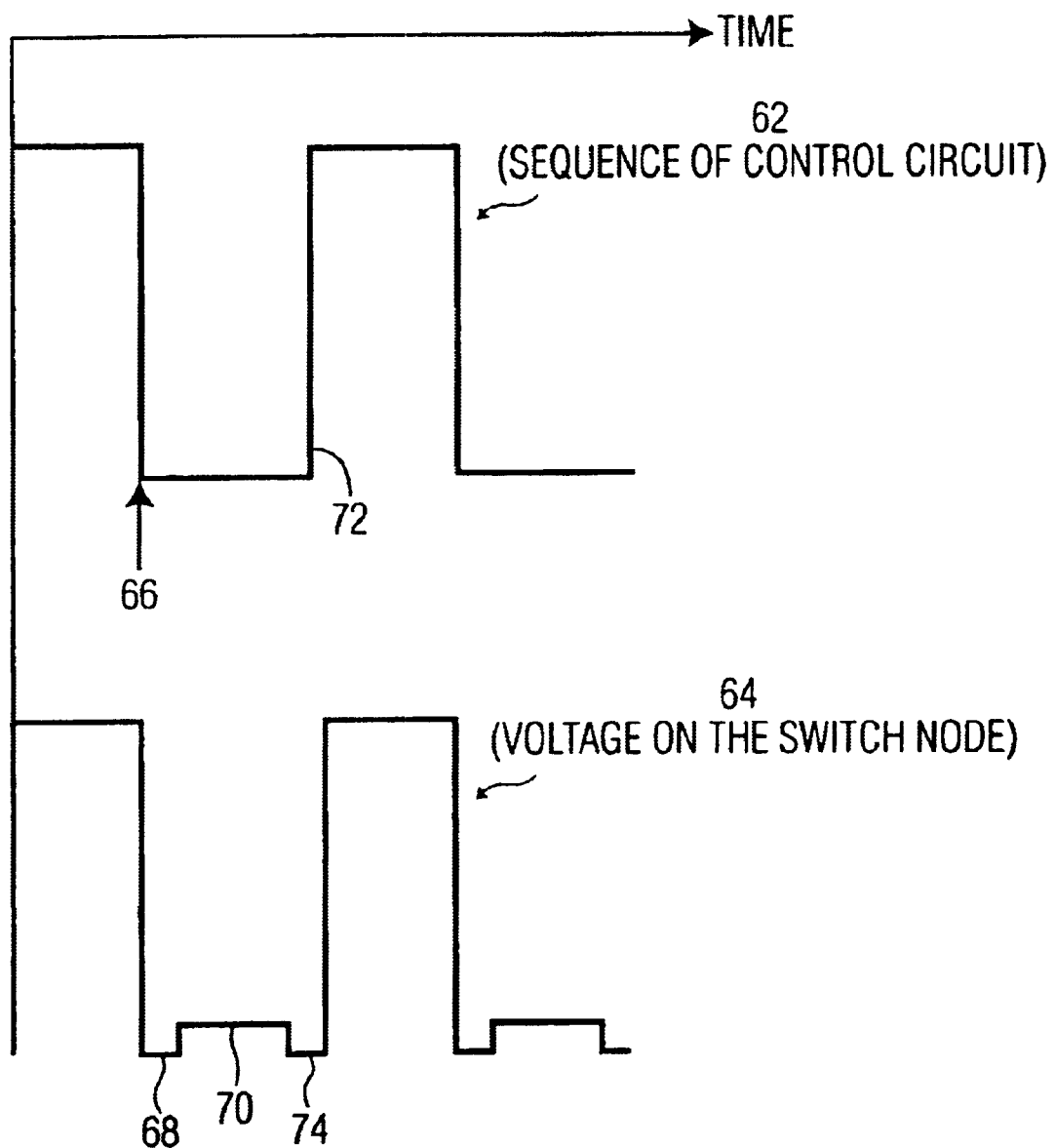
FIG. 3 is a schematic diagram of the control and switch node voltages of the circuit of FIG. 2.

The voltage 64 on the switch node is illustrated in the lower part of FIG. 3. When the control signal falls, the control FET 6 is switched off 66. This causes the voltage at the switch node 10 to start to fall, as current continues to be drawn by the inductor 12, but rather than passing through the control FET 6, the current passes through the body diode 9 of the sync FET 8. This process ends with the voltage on the switch node 10 being determined by the voltage drop across the body diode 9 of the sync FET, i.e. around −0.8 V (time 68).

When the voltage on the switch node falls below a predetermined reference value, for example −0.5 V, the comparator 40 is triggered which supplies a signal to the latch 45. This switches on the low-side driver 32, since the other input to the AND gate, the inverted control signal, is already positive. The low side driver 32 in turn switches on the sync FET. Since the voltage on the switch node 10 will not fall negative until the control FET is switched off, the danger of shoot through is averted.

With the sync FET switched on, and entering saturation, the voltage on the switch node rises 70 to approximately −0.1 V.

When the control signal rises 72, first the sync FET is switched off. Again, current is transferred to the body diode of the sync FET which makes the voltage on the switch node 10 more negative 74. When the voltage falls below the predetermined voltage, the comparator 40 is triggered which allows the control FET 6 to be switched on 76, since the control signal has already risen.

The cycle then repeats.

Thus the control FET is only turned on when it detects, via the switch node, that the body diode of the sync FET is conducting. It is believed that this is a more accurate way of determining that the sync FET is switched off than prior art approaches using the gate voltage of the sync FET. This increased accuracy can result in shorter dead times when neither FET conducts, which can be a real problem in rapidly switching devices.

Further, both FETs use the same reference point, i.e. the voltage on the switch node. Thus, only one comparator circuit is required. Alternatively, separate trigger circuits can be used, which allows the control and sync FET driver circuits 30,32 to be separated.

Figure 4:
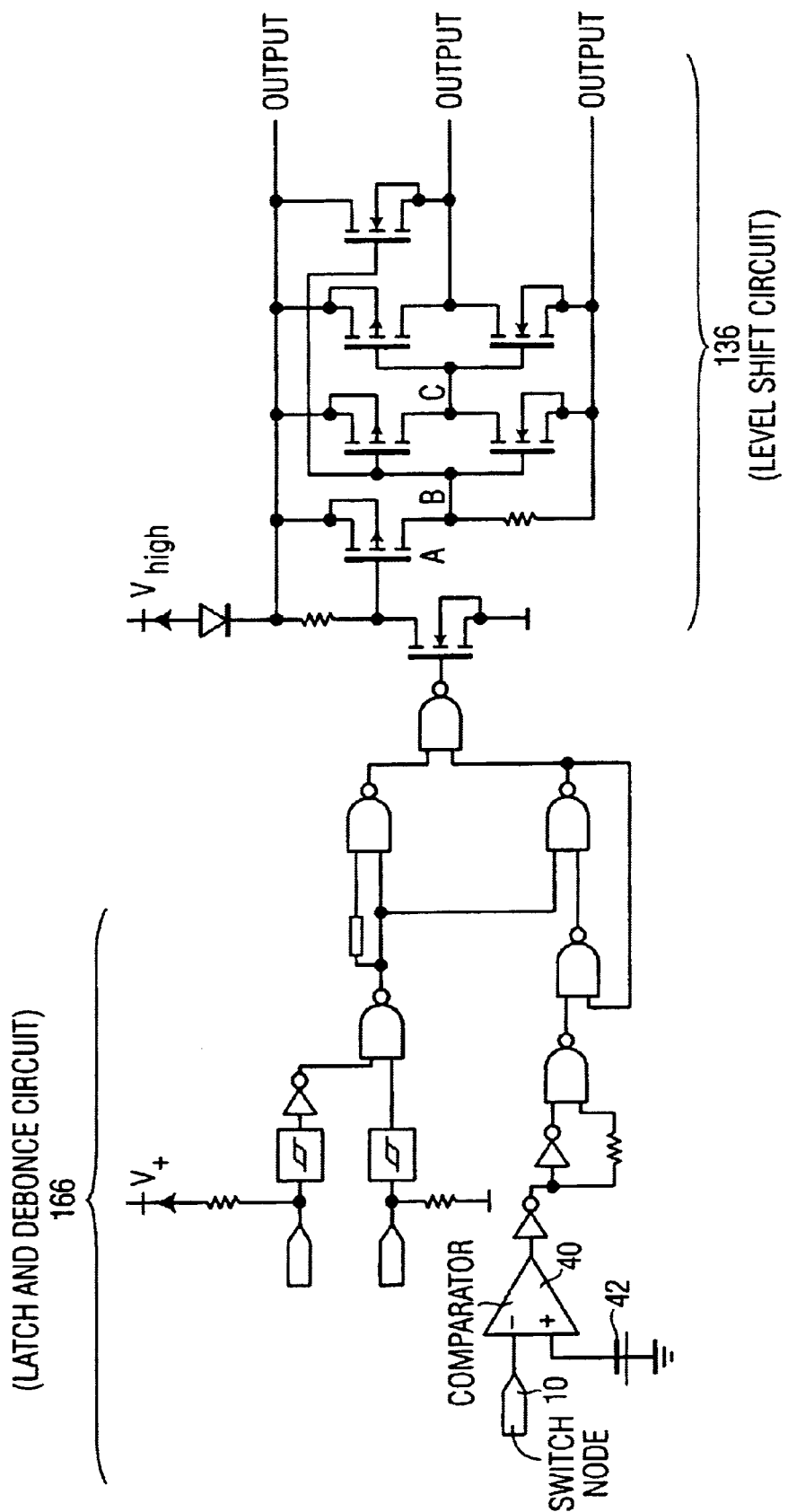
FIG. 4 is a schematic diagram of a part of the circuit of FIG. 2 in greater detail.

FIG. 4 illustrates in more detail the driver circuit used to implement the triggering and driving of the transistors. The comparator 40 feeds into a latch and debounce circuit 166 and this in turn through a NAND gate to a level shift circuit 136. The level shift circuit is illustrated for the case of the circuit that drives the sync FET 8. A similar circuit can be used to drive the control FET 6. The level shift circuit 136 provides a suitable voltage control signal to the gate 110 of the sync FET that is referenced to the voltages on the source 108 and drain 106 of the sync FET rather than referenced to the driver circuit voltage on terminal 36.

Figure 5:
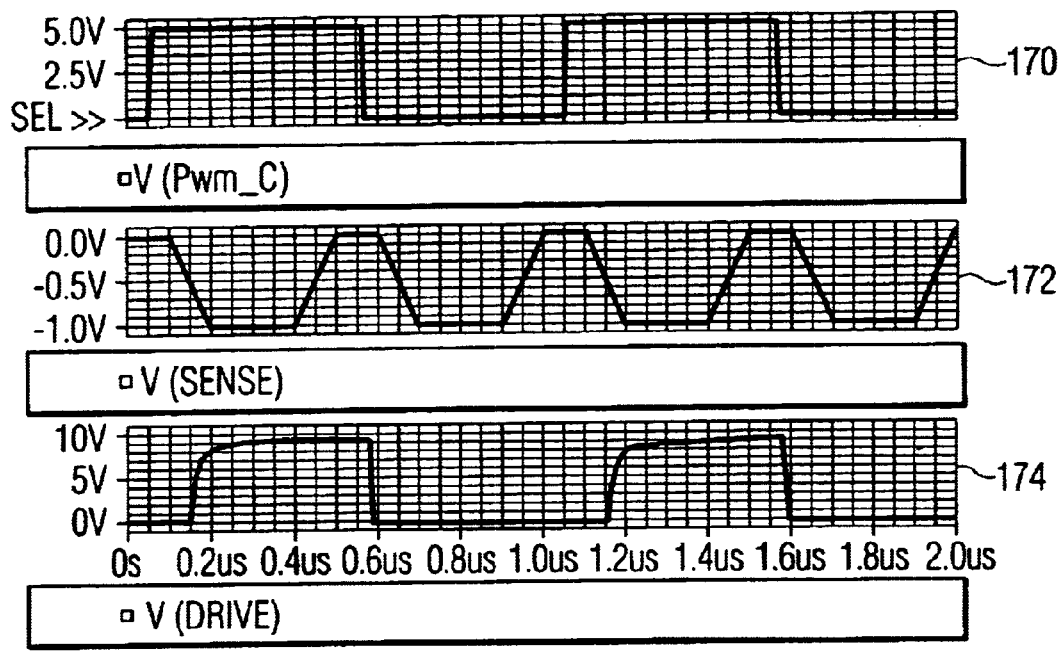
FIG. 5 shows the high side voltages as determined by SPICE simulation.
Figure 6:
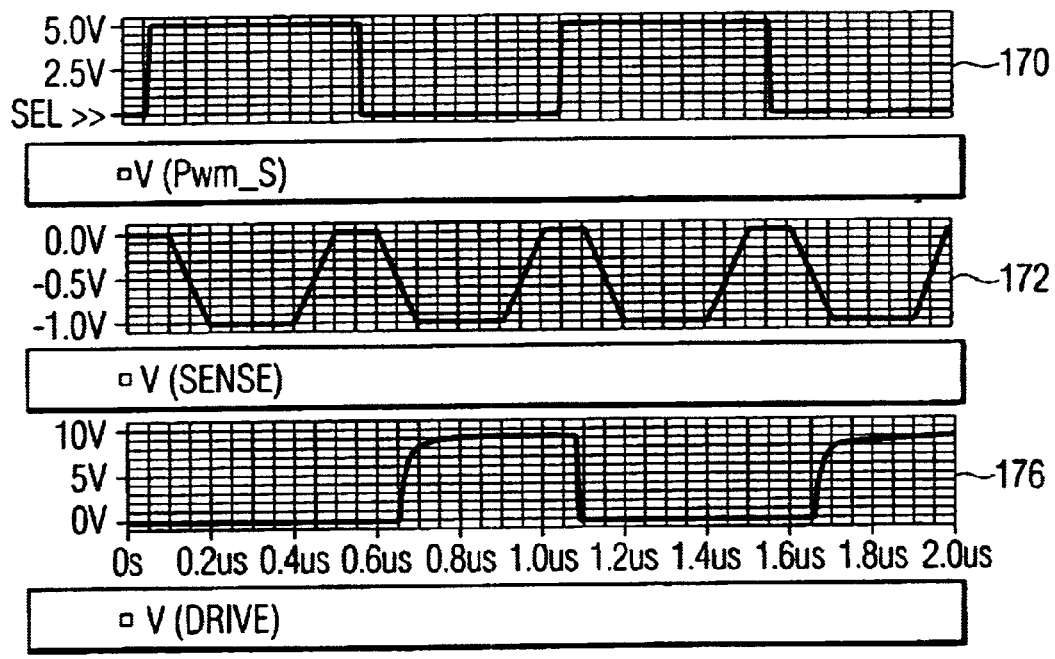
FIG. 6 shows the low side voltages as determined by SPICE simulation.

SPICE simulation of the circuit of FIGS. 2 to 4 was carried out to produce the results shown in FIGS. 5 and 6. FIG. 5 illustrates the high side results. The upper graph 170 shows the control voltage, the middle graph 172 the voltage applied to the comparator 40 for simulations and the third graph the drive voltage 174 used to drive the control FET 6. In a real device in use the switch node 10 would provide the voltage input to the comparator (middle graph), which would provide a larger voltage swing.

FIG. 6 illustrates the corresponding low side results. The upper two graphs are, of course, the same as in FIG. 5 since the voltages are the same. However, the low side driver voltage 176 illustrated in FIG. 6 is high on the opposite half of the cycle to that of the high side driver voltage illustrated in FIG. 5.

A comparison of FIGS. 5 and 6 will reveal that the voltage at the control and sync FETs is never high simultaneously, i.e. that the control and sync FETs are never turned on at the same time, as desired.

As in conventional synchronous dc—dc converter circuits, the mark-space ratio of the control signal is adjusted by the control circuit 18 using feedback loop 22 to obtain the desired voltage at the output 16.

Figure 7:
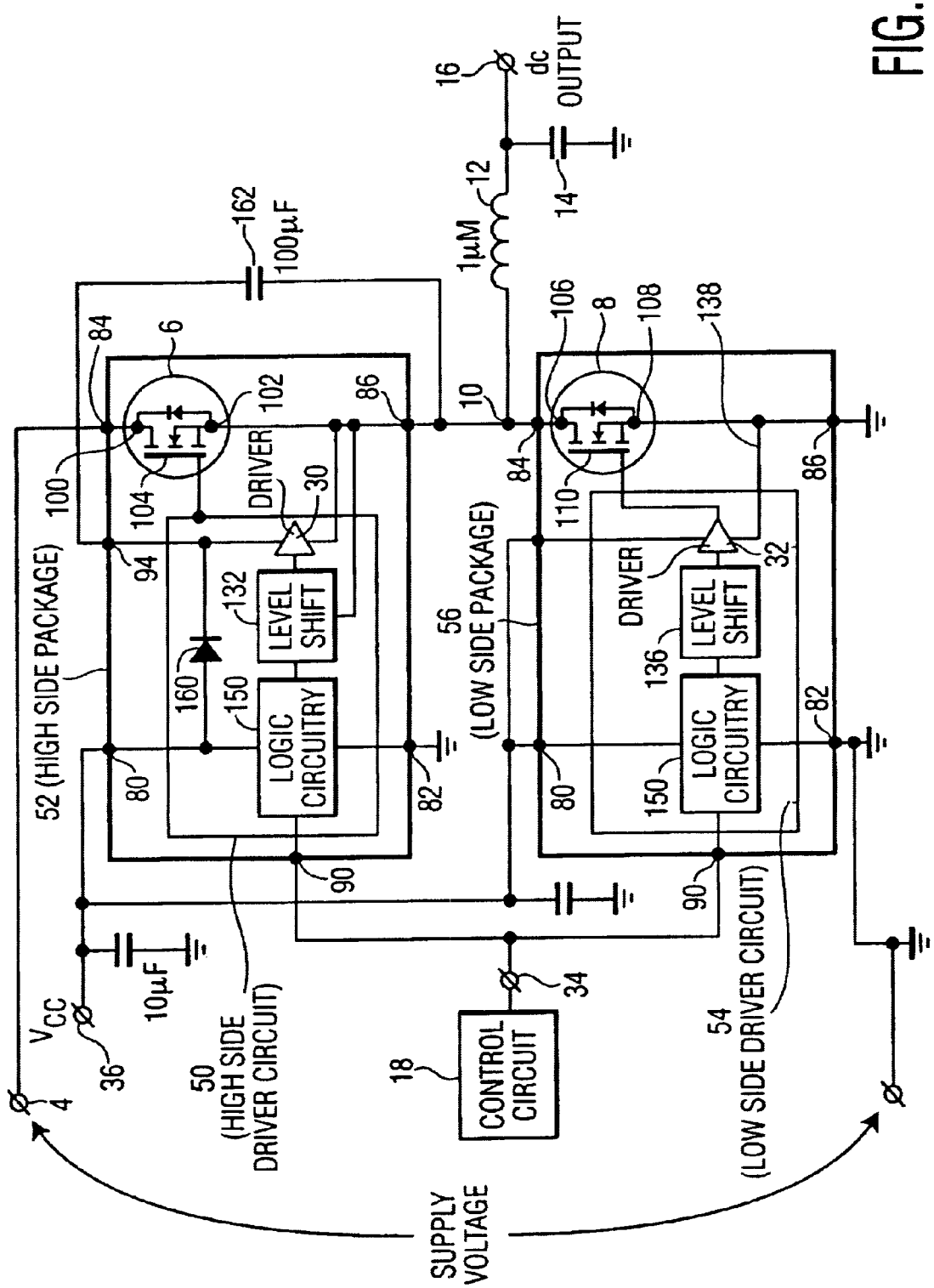
FIG. 7 shows a schematic diagram of a second embodiment of a synchronous converter according to the invention.

One benefit of the invention is that it permits the production of separate high side and low side driver circuits, as will now be illustrated with reference to FIG. 7.

The circuit is similar to that of FIG. 2. One important difference is that the control FET 6 is packaged together with the corresponding high side driver circuitry 50 in a package 52. The sync FET 8 is packaged with corresponding low side driver circuitry 54 in another package 56. The driver circuitry 50,54 in both of the packages 52, 56 contains logic circuitry 150 for only switching on the corresponding FET when the switch node 10 voltage falls below a predetermined value. This means that there is no need for communication between the packages 52, 56, except that both are commonly driven by the same control pulse on input 34.

Thus separate packages 52, 56 are provided that in combination prevent shoot through. The integration of the drivers with the corresponding FETs within the same package and without needing additional signals from other circuit elements to prevent shoot-through means that the arrangement of FIG. 7 is capable of high speed switching.

A driver voltage for driving the drivers 50,54 is provided to input 80 on both packages 52 and 56. The packages also have ground inputs 82, signal inputs 90, drain inputs 84 and source inputs 86. Thus, the drain input 84 for providing the high side drain voltage to the FET is separate from the input driving the drivers 50,54.

A boost capacitor 162 is connected across the high side driver 30. The boost capacitor 162 maintains the driver 30 voltage, and is topped up through boost diode 160 between voltage input 80 and boost capacitor terminal 94 on the high side component 52.

On the low side 56, the driver 32 is isolated from control circuit 150 by level shift circuit 136. The low side driver return is through direct connection 138 to the source 108 of the sync FET 8. This provides a low inductance return path for current used to drive the gate 110 of the sync FET 8. This can greatly reduce ground bounce, and the effect of parasitic inductance, so improving switching times. The high side driver 30 is similarly isolated by level shift circuit 132.

Any convenient PWM control circuit 18 may be used in combination with the packages 52, 56 to deliver a synchronous dc—dc converter. In particular, high speed switching is possible.

Since the control and sync FET drivers 30,32 are not connected, the trigger that switches on the control and sync FETs 30,32 need not occur at the same voltage on the switch node 10. For example, either the control FET 6 or the sync FET 8 may be triggered, following a change of polarity of the signal input, when a negative going edge is detected on the switch node 10. In contrast, the sync FET 8 is triggered, following a change of polarity of the signal input, when a predetermined voltage, e.g. −0.7 V, is detected on the switch node 10. With separate control FET and sync FET sense circuits 153, the predetermined trigger voltage used to trigger the sync FET 8 does not need to be negative, just lower than the voltage at the switch node 10 with the control FET 6 switched on.

Figure 8:
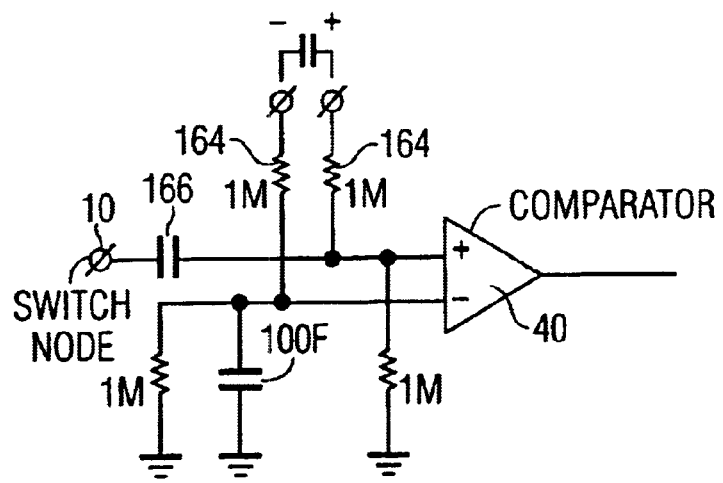
FIG. 8 illustrates a modification to the triggering arrangement according to the invention.

FIG. 8 illustrates a modification to part of the circuit of FIG. 4 that can be used to detect a negative going edge on the switch node 10 rather than a predetermined negative voltage. Essentially, the comparator 40 is coupled to the switch node 10 through a capacitor 166, with resistors 164 providing a dc voltage level.

Figure 9:
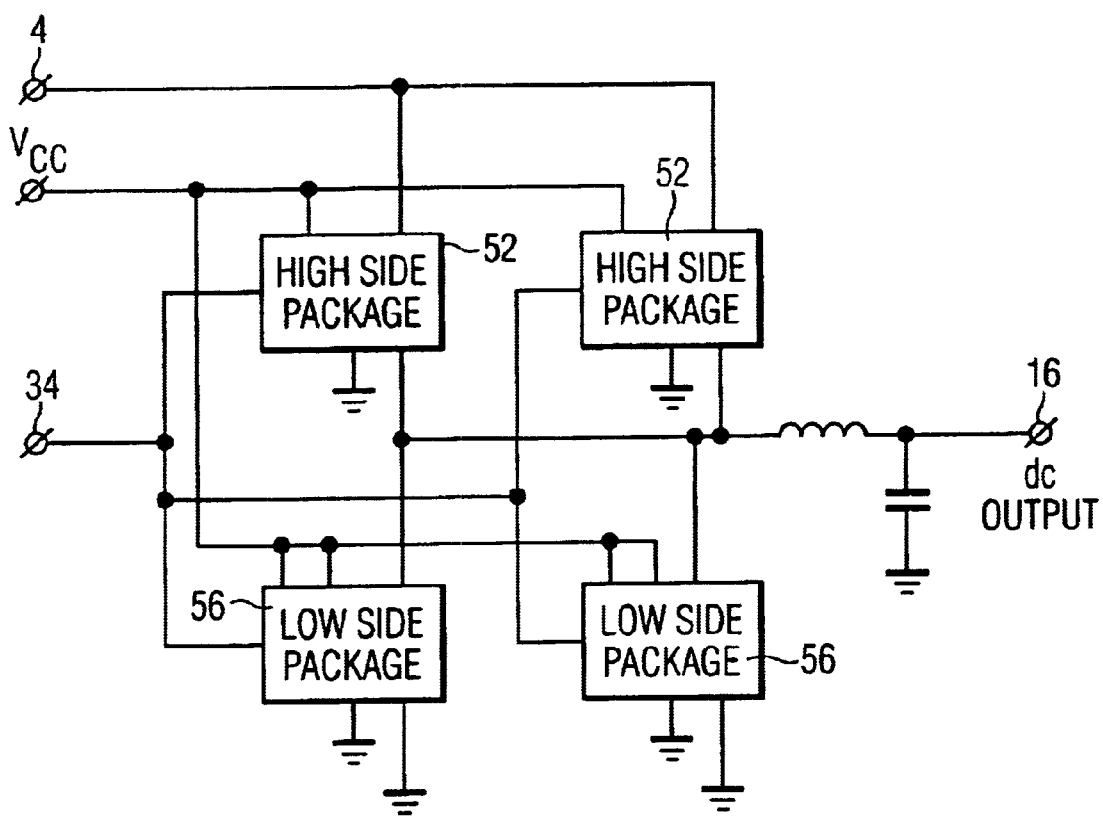
FIG. 9 shows how the devices of the second embodiment can be arranged in parallel.

As illustrated in FIG. 9, the packages 52, 56 can easily be arranged in parallel. Each driver separately ensures that the corresponding FET is not switched on unless the opposite FETs are switched off, thus avoiding shoot through.

The dc—dc converters of the present invention may be used wherever dc—dc converters are required, for example for motherboard VRMs.

The invention is not limited to the embodiments described and the skilled person will readily conceive of other possibilities.

The triggering can be carried out in a variety of ways. The circuit can detect either a fixed voltage, for example a predetermined negative voltage in the region −0.15 V to −0.5 V, or sense a negative-going edge. This may be done by ac-coupled sensing.

The sync FET 8 and the control FET 6 may use different circuits, and these do not necessarily have to be the same. For example, the predetermined negative voltage to trigger the sync FET 8 may be different to that used to trigger the control FET 6. Alternatively, one of the control and sync FETs 6,8 may detect a negative-going edge whereas the other may detect a predetermined negative voltage.

Although the embodiments described use feedback it is also possible to drive the invention without such feedback. In this approach, the alternating signal applied to signal input node 34 can simply have a predetermined mark-space ratio for producing a desired output voltage at output 16.

The ways in which the components are divided between packages can be varied as required. Further, although in the arrangements described both FETs 6,8 are n-channel, either or both may be p-channel. By using a p-channel control FET 6, the boost capacitor 162 and boost diode 160 may be eliminated.

What is claimed is:

1. A synchronous dc—dc converter circuit for converting an input dc voltage of predetermined polarity to an output dc voltage, the synchronous dc—dc converter circuit comprising:
    a dc input and a ground input for supplying the input dc voltage;
    a control FET having source and drain connected between the dc input and a switch node, the switch node being for connection through an inductor to a dc output for supplying the output dc voltage;
    a sync FET having source and drain connected between the switch node and the ground input;
    a switching input for inputting an alternating control signal;
    a comparator for detecting a voltage change on the switch node of opposite polarity to the dc input voltage and sending out a trigger signal in response; and
    at least one driver for driving the control and sync FETs alternately in response to the alternating control signal on the switching input,
    wherein the driver, in response to a change in the alternating control signal of a predetermined polarity, switches off the sync FET, and then waits for the trigger signal before switching on the control FET.

2. A synchronous dc—dc converter according to claim 1 wherein, in response to a change in polarity of the alternating control signal of opposite polarity to the predetermined polarity, the at least one driver switches off the control FET, waits for the trigger signal and then switches on the sync FET.

3. A synchronous dc—dc converter circuit according to claim 1, wherein the comparator sends out the trigger signal when the switch node voltage passes a predetermined reference value of opposite sign to the dc input voltage.

4. A synchronous dc—dc converter according to claim 1 further comprising a control circuit connected to the switching input for supplying the alternating control signal to the at least one driver.

5. A synchronous dc—dc converter according to claim 1 further comprising a capacitor connected between the dc output and ground.

6. A synchronous dc—dc converter according to claim 5 further comprising a feedback path from the dc output to the control circuit for generating the alternating control signal in dependence on the measured output voltage.

7. A high side component for a synchronous dc—dc converter circuit for converting an input dc voltage of predetermined polarity to an output dc voltage, the high side component comprising:
    a dc input for supplying the input dc voltage;
    a control FET having source and drain connected between the dc input and a switch node, the switch node being for connection through an inductor to a dc output for supplying the output dc voltage;
    a switching input for inputting an alternating control signal;
    a comparator for detecting a voltage change on the switch node of opposite polarity to the dc input voltage and sending out a trigger signal in response; and
    at least one driver for driving the control FET in response to the alternating signal on the switching input wherein in response to a change in polarity of the alternating signal of first predetermined sign the driver switches off the control FET and in response to a change in polarity of the alternating signal of second predetermined sign the driver waits for the trigger signal and then switches on the control FET.

8. A high side component circuit according to claim 6 wherein the comparator that sends out the trigger signal when the switch node voltage passes a predetermined reference value of opposite sign to the dc input voltage.

9. A method of operating a synchronous dc—dc converter circuit having a control FET connected between an input dc terminal and a switch node and a sync FET connected between the switch node and a ground terminal, the method comprising:
    supplying an input dc voltage of predetermined polarity between the input dc terminal and the ground terminal;
    supplying a pause width modulated alternating signal to a switching input; and
    driving the control and sync FETs alternately in response to the alternating signal on the switching input, by:
        in response to a change in polarity of the alternating signal from a first polarity to a second polarity carrying out the steps of switching off control FET, detecting a voltage change on the switch node of opposite polarity to the dc input voltage, and then switching on the sync FET, and
        in response to a change of polarity of the alternating signal from the second polarity to the first polarity carrying out the steps of switching off the FET, detecting a voltage change on the switch node of opposite polarity to the dc input voltage, and then switching on the control FET said switching node being connected through an inductor to a dc output for supplying the dc output voltage.

10. A method according to claim 9 wherein the step of detecting an voltage change on the switch node includes detecting when the switch node voltage passes a predetermined reference value of opposite sign to the dc input voltage.

* * * * *